United States Patent
Tao et al.

(10) Patent No.: US 10,637,511 B2
(45) Date of Patent: *Apr. 28, 2020

(54) DYNAMIC MULTI-STAGE DECODING

(71) Applicant: Western Digital Technologies, Inc., San Jose, CA (US)

(72) Inventors: Jun Tao, Ladera Ranch, CA (US); Niang-Chu Chen, Irvine, CA (US)

(73) Assignee: Western Digital Technologies, Inc, San Jose, CA (US)

( * ) Notice: Subject to any disclaimer, the term of this patent is extended or adjusted under 35 U.S.C. 154(b) by 198 days.

This patent is subject to a terminal disclaimer.

(21) Appl. No.: 15/846,020

(22) Filed: Dec. 18, 2017

(65) Prior Publication Data

US 2019/0190541 A1 Jun. 20, 2019

(51) Int. Cl.
| | | |
|---|---|---|
| *H03M 13/00* | (2006.01) | |
| *H03M 13/37* | (2006.01) | |
| *G11C 29/52* | (2006.01) | |
| *G06F 11/10* | (2006.01) | |
| *H03M 13/11* | (2006.01) | |

(52) U.S. Cl.
CPC ..... *H03M 13/3746* (2013.01); *G06F 11/1012* (2013.01); *G06F 11/1068* (2013.01); *G11C 29/52* (2013.01); *H03M 13/1108* (2013.01); *H03M 13/1111* (2013.01); *H03M 13/3715* (2013.01); *H03M 13/3738* (2013.01); *H03M 13/6325* (2013.01); *H03M 13/1105* (2013.01)

(58) Field of Classification Search
CPC .......... H03M 13/3746; H03M 13/1105; G06F 11/1068; G11C 29/52
See application file for complete search history.

(56) References Cited

U.S. PATENT DOCUMENTS

| | | | | |
|---|---|---|---|---|
| 8,184,480 | B2* | 5/2012 | Aoyagi | G11C 11/5642 365/185.03 |
| 8,935,595 | B2 | 1/2015 | Zhong et al. | |
| 9,007,854 | B1* | 4/2015 | Nemati Anaraki | G06F 11/10 365/189.09 |
| 9,397,701 | B1 | 7/2016 | Micheloni et al. | |
| 9,407,294 | B2 | 8/2016 | Hanham et al. | |
| 9,502,117 | B2 | 11/2016 | Chen et al. | |
| 9,563,502 | B1 | 2/2017 | Alhussien et al. | |
| 9,647,695 | B2* | 5/2017 | Kim | G06F 11/1048 |
| 9,703,628 | B2* | 7/2017 | Han | G06F 11/00 |

(Continued)

OTHER PUBLICATIONS

Wang, Jiadong, Soft Information for LDPC Decoding in Flash: Mutual-Information Optimized Quantization, http://www.seas.ucla.edu/dsl/files/publications/Jiadong_GC2011.pdf, 6 pages.

*Primary Examiner* — Esaw T Abraham
(74) *Attorney, Agent, or Firm* — Morgan, Lewis & Bockius LLP

(57) ABSTRACT

Methods and systems for decoding raw data may include determining a sequence of a plurality of read-level voltages based on previous decoding data and executing a multi-stage decoding operation to decode raw data read from the plurality of memory cells using the determined sequence of the plurality of read-level voltages. Decoded data is returned from the multi-stage decoding operation upon completion of the multi-stage decoding operation and the previous decoding data is updated based on results of the multi-stage decoding operation.

24 Claims, 4 Drawing Sheets

(56) References Cited

U.S. PATENT DOCUMENTS

| | | | |
|---|---|---|---|
| 9,715,429 B1* | 7/2017 | Lin | G06F 3/0619 |
| 9,761,308 B1* | 9/2017 | Cometti | G11C 29/52 |
| 9,910,594 B2* | 3/2018 | Rajwade | G06F 3/0604 |
| 9,952,926 B2* | 4/2018 | Yen | G11C 29/021 |
| 10,025,661 B1* | 7/2018 | Shukla | G06F 11/1012 |
| 2007/0047300 A1* | 3/2007 | Lee | G11C 11/5642 |
| | | | 365/185.03 |
| 2015/0095736 A1 | 4/2015 | Leem et al. | |
| 2015/0169402 A1 | 6/2015 | Wu et al. | |
| 2015/0365106 A1 | 12/2015 | Wu et al. | |

* cited by examiner

DYNAMIC MULTI-STAGE DECODING

BACKGROUND

Flash memory may introduce data errors to data stored therein due to variations in the memory cells introduced at the time of manufacture or due to changes in behavior as the memory cells age. Error correcting codes may be employed to correct data errors during read operations. For example, low-density parity-check (LDPC) codes can provide robust error correcting capabilities. However, LDPC algorithms codes can add unwanted latency to read operations.

SUMMARY

According to aspects of the subject technology, a machine-implemented method is provided that includes determining a sequence of a plurality of read-level voltages based on previous decoding data and executing a multi-stage decoding operation to decode raw data read from the plurality of memory cells using the determined sequence of the plurality of read-level voltages. Decoded data is returned from the multi-stage decoding operation upon completion of the multi-stage decoding operation and the previous decoding data is updated based on results of the multi-stage decoding operation.

According to aspects of the subject technology, a data storage system is provided that includes a non-volatile memory device and a controller. The controller is configured to determine a sequence of a plurality of read-level voltages based on previous decoding data and execute a multi-stage decoding operation to decode raw data read from the plurality of memory cells using the determined sequence of the plurality of read-level voltages. Each stage of the multi-stage decoding operation includes executing one or more decoding operations to decode raw data read from the plurality of memory cells using a respective read-level voltage from the sequence of the plurality of read-level voltages corresponding to the stage. The stages of the multi-stage decoding operation are executed sequentially until one of the one or more decoding operations in one of the stages successfully decodes the raw data read from the plurality of memory cells. Decoded data is returned from the multi-stage decoding operation upon completion of the multi-stage decoding operation and the previous decoding data is updated based on results of the multi-stage decoding operation.

According to aspects of the subject technology, a processor-readable medium is encoded with executable instructions that, when executed by a processor, perform a method. The method includes determining a sequence of a plurality of read-level voltages based on previous decoding data and executing a multi-stage decoding operation to decode raw data read from the plurality of memory cells using the determined sequence of the plurality of read-level voltages. Decoded data is returned from the multi-stage decoding operation upon completion of the multi-stage decoding operation and the previous decoding data is updated based on results of the multi-stage decoding operation by incrementing a counter value corresponding to a read-level voltage of the plurality of read-level voltages used to read the successfully decoded raw data. The sequence of the plurality of read-level voltages is determined based on the counter value.

According to aspects of the subject technology, a data storage system is provided that includes non-volatile memory and means for determining a sequence of a plurality of read-level voltages based on previous decoding data. The data storage system further includes means for executing a multi-stage decoding operation to decode raw data read from the plurality of memory cells using the determined sequence of the plurality of read-level voltages and means for returning decoded data from the multi-stage decoding operation upon completion of the multi-stage decoding operation. The data storage system further includes means for updating the previous decoding data based on results of the multi-stage decoding operation.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

DETAILED DESCRIPTION

Figure 1:
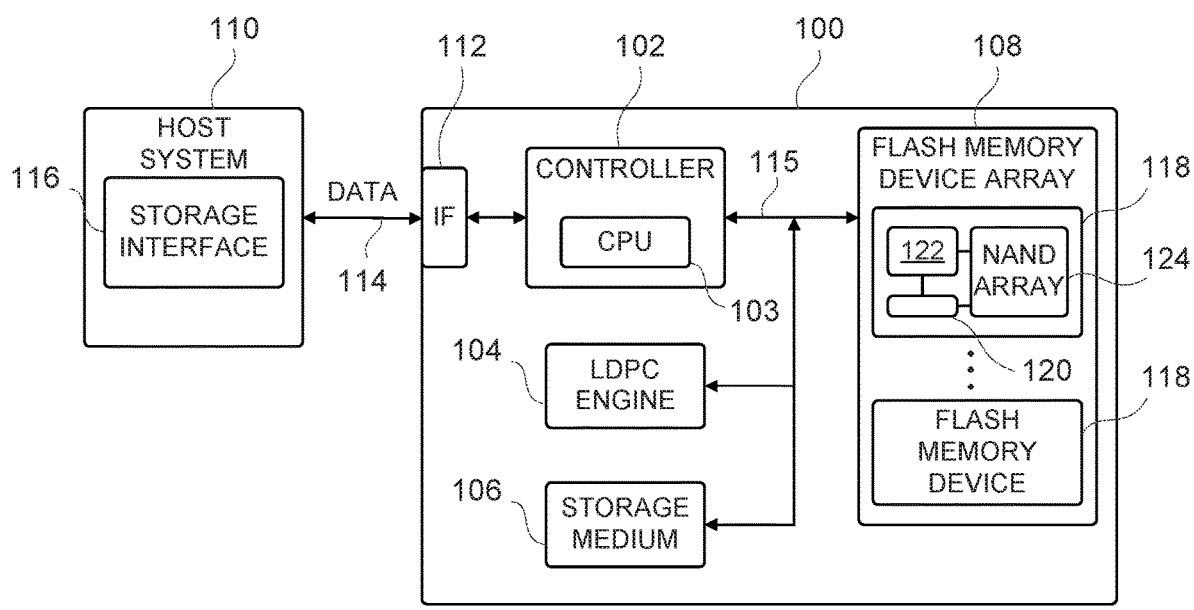
FIG. 1 is a block diagram depicting example components of a data storage system according to aspects of the subject technology.

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, it will be apparent to those skilled in the art that the present disclosure may be practiced without these specific details. In some instances, structures and components are shown in block diagram form in order to avoid obscuring the concepts of the present disclosure. Like components are labeled with identical element numbers for ease of understanding.

LDPC decoding may utilize a multi-stage decoding operation to decode raw data read from a group of memory cells in non-volatile memory such as NAND flash memory. The raw data processed in each stage of the decoding operation may be read from the memory cells using a respective read-level voltage from a sequence of different read-level voltages. Each stage may execute a hard decoding operation on the raw data and/or one or more soft decoding operations on the raw data. The multi-stage decoding operation may execute one stage at a time in a sequence until the raw data read from the memory cells is successfully decoded.

Memory cells in the same block, group of blocks, die, or batch of die may share common characteristics that result in similarities in read errors experienced when reading data from the block, group of blocks, die, or batch of die. Read errors experienced when reading data from memory cells at a similar stage of life also may have similarities. The subject technology leverages these similarities to improve the multi-stage decoding operation by tracking the stage and corresponding read-level voltage at which previous decoding operations successfully decoded the raw data read from memory cells. Read errors experienced in other similarly, situated memory cells may be recovered using a sequence of read-level voltages based on previous successful decoding operations that may shorten the multi-stage decoding operation. As discussed in more detail below, the subject technology modifies the multi-stage decoding operation by determining a sequence of read-level voltages based on previous decoding data indicating which read-level voltages were used to successfully decode raw data in previous read operations. Ordering the read-level voltages in a sequence based on previous successful read operations allows read-level voltages with a higher likelihood of successful decoding to be ordered earlier in the sequence while pushing read-level voltages with a lower likelihood of successful decoding later in the sequence. In this manner, the sequence of read-level voltages is optimized based on previous read operations as the memory cells age or operating conditions change.

FIG. 1 is a block diagram depicting example components of a data storage system 100, according to aspects of the subject technology. Data storage system 100 includes a controller 102, a low-density parity-check (LDPC) engine 104, a storage medium 106, and a flash memory device array 108. As depicted in FIG. 1, data storage system 100 may be connected to a host device 110 via a host interface 112.

Controller 102 may include several internal components such as one or more processors 103, a read-only memory, a flash component interface (for example, a multiplexer to manage instruction and data transport along a connection to flash memory device array 108), an I/O interface, error correction circuitry, and the like. Processor 103 of controller 102 may monitor and control the operation of the components in data storage controller 102. The processor 103 and/or controller 102 may be a multi-core processor, a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more elements of controller 102 may be integrated into a single chip. In other aspects, the elements may be implemented in two or more discrete components.

Controller 102 may be configured to execute code or instructions to perform the operations and functionality described herein. For example, controller 102 may be configured to perform operations for managing request flow and address mappings, and to perform calculations and generate commands. One or more sequences of instructions may be stored as firmware on memory within controller 102. One or more sequences of instructions may be software stored and read from storage medium 106, flash memory device array 108, or received from host device 110 (for example, via host interface 112). Storage medium 106 and flash memory device array 108 represent examples of machine or computer readable media on which instructions/code executable by controller 102 may be stored. Machine or computer readable media may generally refer to any tangible and non-transitory medium or media used to provide instructions to controller 102, including both volatile media, such as dynamic memory used for storage media 102 or for buffers within controller 102, and non-volatile media, such as electronic media, optical media, and magnetic media. The operations and functionality described herein also may be implemented in hardware using logic circuits, for example, or a combination of hardware and software/firmware.

In some aspects, storage medium 106 represents volatile memory used to temporarily store data and information used to manage data storage system 100. According to aspects of the present disclosure, storage medium 106 is a random access memory (RAM) such as double data rate (DDR) RAM. Other types of RAM also may be used to implement storage medium 106. Storage medium 106 may be implemented using a single RAM module or multiple RAM modules. While storage medium 106 is depicted as being distinct from controller 102, it is understood that storage medium 106 may be incorporated into controller 102 without departing from the scope of the present disclosure. Alternatively, storage medium 106 may be a non-volatile memory such as a magnetic disk, flash memory, peripheral SSD, and the like.

Host interface 112 is configured to be coupled to host device 110, to receive data from and send data to host device 110. Host interface 112 may include both electrical and physical connections for operably coupling host device 110 to controller 102. Host interface 112 is configured to communicate data, addresses, and control signals between host device 110 and controller 102. In this manner, controller 102 is configured to store data received from host device 102 in flash memory device array 108 in response to a write command from host device 110, and to read data stored in flash memory device array 108 and to transfer the read data to host device 110 via host interface 112 in response to a read command from host device 110.

Host device 110 represents any device configured to be coupled to data storage system 110 and to store data in data storage system 100. Host device 110 may be a computing system such as a personal computer, a server, a workstation, a laptop computer, PDA, smart phone, and the like. Alternatively, host device 110 may be an electronic device such as a digital camera, a digital audio player, a digital video recorder, and the like.

As further depicted in FIG. 1, host device 110 and data storage system 100 may be in communication with each other via a bus 114. The bus 114 and interface 112 may use suitable interface standards including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe).

Data storage system 100 may include an internal system bus 115. System bus 115 may include a combination of a control bus, address bus, and data bus, and connect the components of controller 102 (e.g., a processor and/or memory therein) with other components of data storage system 100, including storage WPC engine 104, storage medium 106, flash memory device array 108, and host interface 112. Data may be transferred between the various components over system bus 115. System bus 115 may reside partially external and partially internal to controller 102.

Host device 110 and data storage system 100 may be in communication with each other via a wired or wireless connection and may be local to or remote from one another. According to one or more other aspects, data storage system 100 (or host interface 112) includes a wireless transceiver to place host device 110 and data storage system 100 in wireless communication with each other.

Controller 102 may be configured to receive data and/or storage access commands from a storage interface module 116 (e.g., a device driver) of host device 110. Storage access commands communicated by the storage interface module 116 may include read and write commands issued by the host device 110. Read and write commands may specify a logical address (e.g., logical block addresses or LBAs) used to access data stored in the data storage system 100. Controller 102 may execute commands in the flash memory device array 108 in response to commands received from storage interface module 116.

Flash memory device array 108 may include multiple flash memory devices 118. A flash memory device 118 represents a non-volatile memory device for storing data. According to aspects of the subject technology, flash memory device 118 includes, for example, a NAND flash memory. Each flash memory device 118 may include a single flash memory chip or die, or may include multiple flash memory chips or die. For example, within flash memory device array 108, some of the flash memory devices 118 may comprise one flash die while others may comprise more than one flash die. Flash memory device 118 is not limited to any particular capacity or configuration. For example, the number of physical blocks, the number of physical pages per physical block, the number of sectors per physical page, and the size of the sectors may vary within the scope of the subject technology.

The flash memory device array 108 may be arranged in multiple channels, with each channel having one or more flash memory devices 118. A flash memory device 118 may include one or more flash memory interfaces (not shown). Each flash memory interface interfaces the controller 102 to one of the flash memory devices via a corresponding channel. Each of the channels (not shown) may be implemented using one or more physical I/O buses coupled between one of the flash memory interfaces and the corresponding flash device(s). Each channel allows the corresponding flash memory interface to send read, write and/or erase commands to the corresponding flash memory device. Each flash memory interface may include a register (e.g., First-In-First-Out (FIFO) register) that queues read, write and/or erase commands from the controller 102 for the corresponding flash memory device. Although the term "channel," as used above, referred to the bus coupled between a flash memory interface and the corresponding flash memory device, the term "channel" may also refer to the corresponding flash memory device that is addressable through a bus (e.g., system bus 115).

Flash memory devices 118 may have a standard interface specification. This standard ensures that chips from multiple manufacturers can be used interchangeably (at least to a large degree). The interface of flash memory devices 118 may be used to access internal registers 120 and an internal flash controller 122. In some aspects, registers 120 may include address, command, and/or data registers, which internally retrieve and output the necessary data to and from a NAND memory cell array 124. By way of example, memory cell array 124 may comprise a single-level cell (SLC) memory, a multi-level cell (MLC) memory, a three-level cell (TLC) memory device, etc. In some aspects, the flash memory device array 108 may comprise one or more hybrid memory devices that may function in one or more of a SLC, MLC or TLC mode. Other types of flash memory such as 3D NAND flash memory also are contemplated in the subject technology.

A data register (e.g., of registers 120) may include data to be stored in memory cell array 124, or data after a fetch from memory cell array 124, and may also be used for temporary data storage and/or act like a buffer. An address register may store the memory address from which data will be fetched to host device 110 or the address to which data will be sent and stored. In some aspects, a command register is included to control parity, interrupt control, and the like. In some aspects, internal flash controller 122 is accessible via a control register to control the general behavior of flash memory device 118. Internal flash controller 122 and/or the control register may control the number of stop bits, word length, receiver clock source, and may also control switching the addressing mode, paging control, coprocessor control, and the like.

LDPC engine 104 represents one or more components configured to encode and/or decode code words to be stored in and/or read from the flash memory device array 108. LDPC engine 104 may include an encoder and a decoder. The decoder may include a hard decoder and a soft-decision ECC decoder. LDPC engine 104 may encode data received from host device 100 into code words and decode code words read from the flash memory array 118 before sending the decoded data to the host. In some implementations, LDPC engine 104 may comprise one or more memory devices and/or one or more processing units used to perform error correction (e.g., using LDPC or turbo codes). LDPC engine 104 may also include a soft information module that determines and/or maintains soft metric inputs for encoding and decoding operations. While LDPC engine 104 is depicted as being distinct from controller 102, it is understood that LDPC engine 104 may be incorporated into controller 102 without departing from the scope of the present disclosure.

Figure 2:
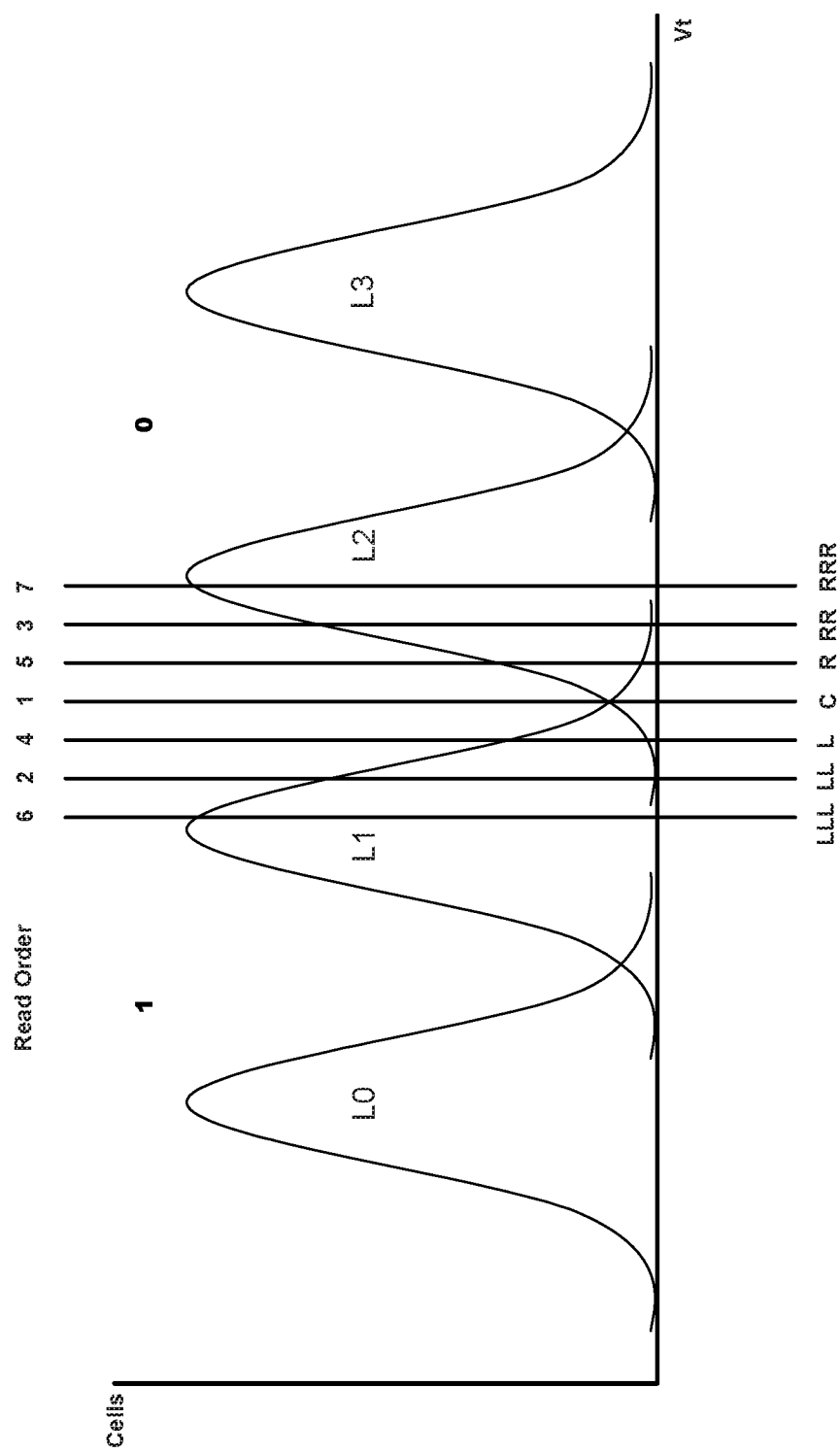
FIG. 2 depicts an example graph diagram illustrating four possible cell program distributions in a multi-level cell flash memory according to aspects of the subject technology.

FIG. 2 depicts an example graph diagram illustrating four possible cell program distributions in a multi-level cell (MLC) flash memory, according to aspects of the subject technology. As depicted, MLC NAND cells may be programmed to one of four different states or program levels, L0, L1, L2, and L3, yielding two logical bits of information per cell: the Most Significant Bit (MSB) and the Least Significant Bit (LSB). When memory cells are read or programmed, these two bits may make up corresponding MSB and LSB pages of a wordline in a memory block. Program levels L0 and L1 may correspond to an LSB logical bit value of "one" and program levels L2 and L3 may correspond to an LSB logical bit value of "zero." While not indicated in FIG. 2, program levels L0 and L3 may correspond to an MSB logical bit value of "one" and program levels L1 and L2 may correspond to an MSB logical bit value of "zero."

To read raw data from the memory cells, a read-level voltage is applied to the memory cells and memory cells having a threshold voltage (Vt) at or below the applied read-level voltage and therefore turn on or conduct are considered to be part of a program distribution below the read-level voltage and those memory cells having a threshold voltage above the read-level voltage and therefore do not turn on or conduct are considered to be in a program distribution above the read-level voltage. For example, FIG. 2 depicts a read-level voltage C that may be applied to a group of memory cells to determine which cells are programmed in either the L0 or L1 program levels corresponding to an LSB logical bit value of "one" or the L2 or L3 program levels corresponding to an LSB logical bit value of "zero."

As flash memory is cycled (that is, programmed and erased repeatedly), its physical qualities change. For example, the repeated placement and removal of electrons on the floating gate during programming and erase operations, respectively, may cause some electrons to be trapped in the floating gate of the device. The threshold voltages of these memory cells may eventually take on values that are different (higher or lower) than expected values, causing the cell programming distributions ultimately begin to overlap, and causing read errors when the data is read.

To determine a probability that the memory cells were actually programmed to the observed putative program levels (i.e., read raw data), multiple read operations may be initiated as part of a multi-stage decoding operation. For example, the memory cells may be read at read-level voltage C in a first stage, at read-level voltage LL in a second stage, at read-level RR in a third stage, etc. The sequence of read-level voltages sets up multiple program regions that may be used to categorize the raw data values read from the memory cells for soft decoding, should hard decoding of the raw data fail.

In a first stage of the multi-stage decoding operation, two program regions may be defined. A first program region includes cells having a programmed value at or below read-level voltage C and a second program region includes cells having a programmed value above read-level voltage C. In the second stage of the multi-stage decoding operation, three program regions may be defined by aggregating the raw data read using read-level voltage C with raw data read using read-level voltage LL. More particular, a first program region may include cells having a programmed value at or below read-level voltage LL, a second program region may include cells having a programmed value above read-level voltage LL and at or below read-level voltage C, and a third program region may include cells having a programmed value above read-level voltage C. Each subsequent stage in the multi-stage decoding operation aggregates raw data read using the read-level voltage corresponding to the stage with the raw data read in the preceding stages to define additional program regions corresponding to the ranges of program values between the different read-level voltages. The subject technology is not limited to the number of read-level voltages represented in FIG. 2 or to the read order indicated in FIG. 2 for applying the read-level voltages in respective stages of the multi-stage decoding operation. In addition, similar sequences of read-level voltages may be used for reading the MSB bit values in the regions between the L0 and L1 program levels and between the L2 and L3 program levels.

According to aspects of the subject technology, confidence values may be assigned to the respective program regions or "bins" for use in soft-decoding operations. Confidence values may include log-likelihood ratios (LLRs). In low-density parity-check (LDPC) applications, a binary LLR may include the logarithm of a ratio between the probability of a bit being "0" or "1". A positive LLR may indicate that a signal read from the memory cell may likely be a 0-bit, and a negative LLR may indicate that the signal read from the memory cell may likely be a 1-bit. In some examples, a bit value having an assigned LLR equal to five may be more likely to be a first predetermined value (e.g., a binary "0") than a bit value having an assigned LLR equal to a second predetermined value (e.g., a binary "1"). A bit value having an assigned LLR equal to zero may be equally likely to be either predetermined value. An LLR may also be represented by a non-binary confidence vector having a group of component values.

As introduced above, each stage of the multi-stage decoding process defines a set of program regions or bins. Each set of program regions or bins has a set of confidence values (e.g., LLR values) corresponding to the respective program regions or bins of the set. These confidence values may be referred to as decoding information and may be stored in respective tables or other data structures that are retrieved when performing soft decoding operations in each of the stages.

According to various implementations, when performing decoding operations LDPC engine 104 may use different sets of decoding information and different orderings of the sets of decoding information for each stage of decoding. Further, different sets of decoding information may be used based on the age of a respective block(s) of the memory device. For example, the age of a block(s) may be based on a number of programming/erase cycles associated with the block, and there may be a different group of sets of decoding information for each predetermined range of programming/erase cycles (and/or for each read-level voltage). According to aspects of the subject technology, each stage of decoding may use multiple sets of decoding information (e.g., three) with separate soft decoding operations being performed using respective sets of decoding information.

Figure 3:
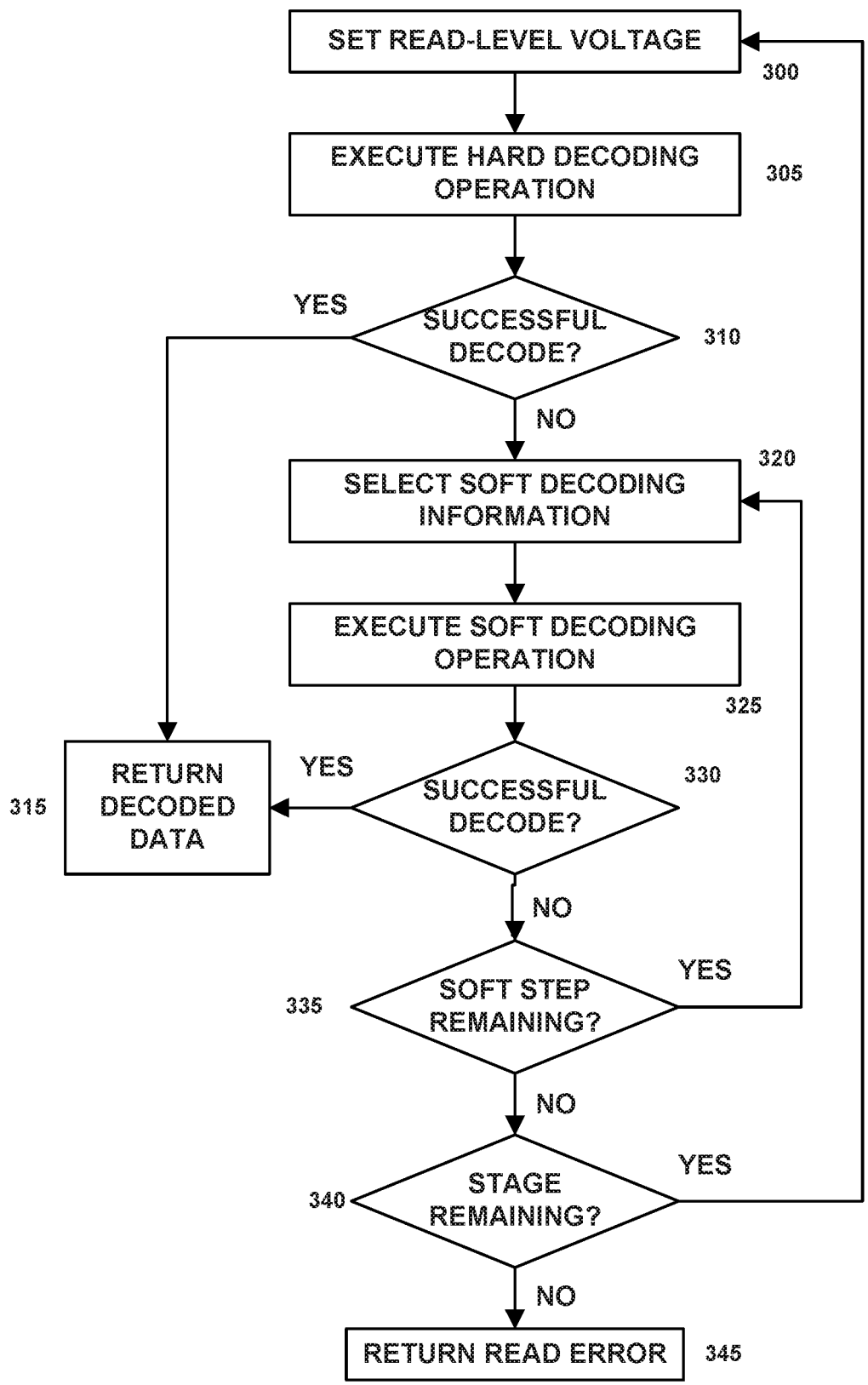
FIG. 3 depicts a flow diagram of a multi-stage decoding operation according to aspects of the subject technology.

FIG. 3 depicts a flow diagram of a multi-stage decoding operation according to aspects of the subject technology. The multi-stage decoding operation may be initiated in response to a read command received from host system 110 or in response to an internal data management operation executed by controller 102. Upon initiating the multi-stage decoding operation, a read-level voltage for the flash memory device 118 from which requested data is to be read is set according to a sequence of read-level voltages (block 300). Initially, the read-level voltage may be set to the C read-level voltage. The read-level voltage may be set by programming a register in the flash memory device with a value corresponding to read-level voltage C.

With the read-level voltage set, raw data is read from a group of memory cells using the set read-level voltage and the raw data is passed to a hard decoder in LDPC engine 104 to execute a hard decoding operation on the raw data (block 305). If the hard decoding operation is successful in decoding the raw data (block 310), the decoded data is returned to the requesting process (block 315). If the hard decoding operation is unsuccessful, soft decoding information is selected (block 320) and the raw data together with the soft decoding information is passed to a soft-decision decoder in LDDC engine 104 to execute a soft decoding operation using the raw data and the selected soft decoding information (block 325).

If the soft decoding operation is successful in decoding the raw data (block 330), the decoded data is returned to the requesting process (block 315). If the soft decoding operation is unsuccessful, the process determines whether another soft step or soft decoding operation remains in the current stage of the multi-stage decoding operation (block 335). According to aspects of the subject technology, each stage of the multi-stage decoding operation may include a hard decoding operation and up to multiple soft decoding operations. Each of the soft decoding operations uses a respective set of soft decoding information corresponding to the current stage. Each set of soft decoding information may be determined or calculated using test or simulation data based on different conditions and assumptions. If the soft decoding operation is unsuccessful using a first set of soft decoding information, the soft decoding operation may be repeated using the same raw data but with a second selected set of soft decoding information (block 320). This loop of soft decoding operations may be repeated until either the raw data is successfully decoded or all of the sets of soft decoding information associated with the current stage have been used in soft decoding attempts. According to aspects of the subject technology, each stage may have three sets of soft decoding information with which to attempt soft decoding of raw data. However, the subject technology may be implemented using more or less than three sets of soft decoding information for each stage.

If no more soft steps or soft decoding operations remain for the current stage (block 335), the operation determines if another stage remains in the multi-stage decoding operation (block 340). The multi-stage decoding operation may include up to seven stages corresponding to the sequence of seven read-level voltages depicted in FIG. 2, for example. If another stage remains in the operation, the next read-level voltage in the sequence is set (block 300) and the stage operations described above repeat. This loop of hard and soft decoding operations repeats until either the raw data is successfully decoded and returned to the requesting process (block 315) or all of the hard and soft decoding operations in each of the stages are unsuccessful. If decoding is unsuccessful, a read error is returned to the requesting process (block 345).

Figure 4:
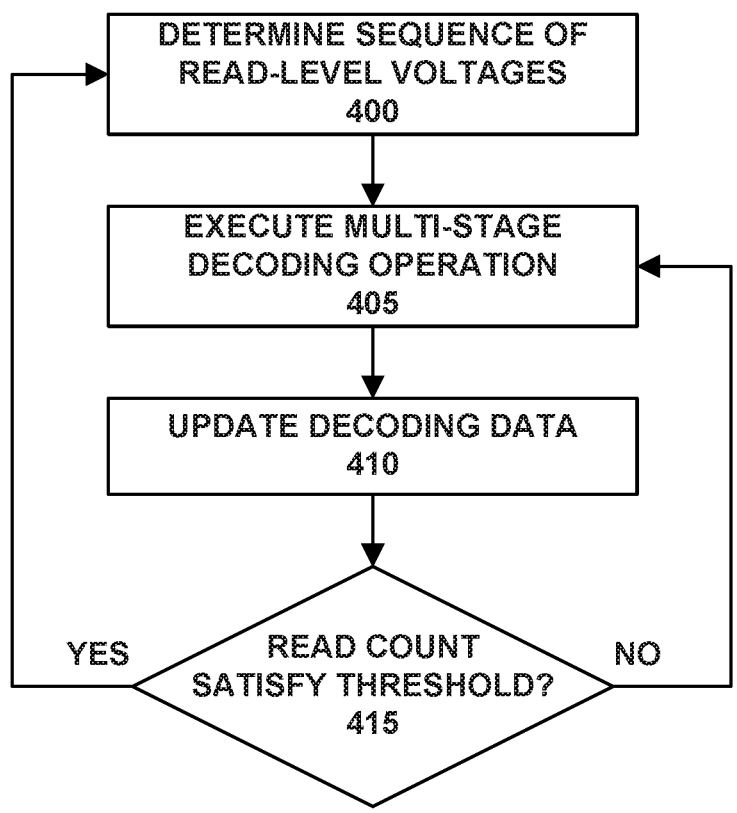
FIG. 4 depicts a flow diagram of a process for adjusting a multi-stage decoding operation according to aspects of the subject technology.

FIG. 4 depicts a flow diagram of a dynamic adjustment of a multi-stage decoding operation according to aspects of the subject technology. Similar to the process described above with respect to FIG. 3, the operation depicted in FIG. 4 may be initiated in response to a read command received from host system 110 or in response to an internal data management operation executed by controller 102.

According to aspects of the subject technology, a sequence of read-level voltages is determined based on previous decoding data (block 400). The previous decoding data contains information on which stages, and corresponding read-level voltages, were successful in decoding the raw data read from flash memory device 118 during previous decoding operations. The previous decoding data may comprise an array of counters corresponding to the read-level voltages, respectively, with each counter containing a counter value indicating a number of decoding operations successfully performed using the respective read-level voltage. For example, the array of counters may comprise seven counters corresponding to the seven read-level voltages illustrated in FIG. 2 (e.g., C, LL, RR, L, R, LLL, RRR). The read order sequence indicated in FIG. 2 represents a default sequence of read-level voltages used at the beginning of life for data storage device 100 or some other stages of initialization.

To determine the sequence of read-level voltages, controller 102 may sort or order the array of counters according to the counter values in the array largest value to smallest value. The sorted array of counters indicates an order of the read-level voltages according to which read-level voltages were more successful in decoding operations. For example, read-level voltage L may have the highest corresponding counter value, followed by read-level voltages RR, C, LL, R, LLL, and RRR. Accordingly, the determined sequence of read-level voltages would be L, RR, C, LL, R, LLL, and RRR, which is subsequently applied in the multi-stage decoding operation described above with respect to FIG. 2 (block 405). When sorting the counter array, counters containing the same counter value may remain in the same order relative to each other as in the default sequence of read-level voltages.

Upon completion of the multi-stage decoding operation, the previous decoding data is updated to reflect the read-level voltage of the decoding stage that successfully decoded the raw data (block 410). For example, the counter in the counter array corresponding to the read-level voltage used in the successful decoding stage is incremented up one.

Sorting or ordering the counter array and determining the sequence of read-level voltages based on the ordered counter array in response to each read command or management operation involving the reading of data may put a large processing load on controller 102 and have minimal impact on the performance of data storage device 100. According to aspects of the subject technology, the determination of the sequence of read-level voltages may be performed following the completion of a predetermined number of read operations since the last determination was made. For example, the sequence may be determined after every 256 read operations are completed (block 415). If the number of read operations since the sequence was last determined does not satisfy the read count threshold of 256, the multi-state decoding operation is performed using the last determined sequence of read-level voltages (block 415). Using 256 read operations as the read count threshold to determine when to perform the determination allows the counter array to comprise one byte of data for each element of the array. The subject technology is not limited to this number of read operations as a read count threshold and may be implemented using other numbers that may be selected or programmed to balance processor load for this background operation with processor loads for other operations performed by controller 102.

A counter array may be maintained for the flash memory device array 108. Alternatively, a counter array may be maintained for respective blocks, groups of blocks, die, groups of die, or individual flash memory devices 118. Maintaining separate counter arrays, and determining sequences of read-level voltages for the corresponding blocks, groups of blocks, die, groups of die, flash memory devices 118, etc. allows the sequences of read-level voltages to better align with the characteristics and conditions of each block, group of blocks, dies, groups of die, or flash memory devices 118 when performing read operations.

In the examples discussed above, the determined sequence of read-level voltages may, include any order of the read-level voltages depending on the previous decoding data used to determine the sequence. The subject technology is not limited to this configuration. According to other aspects of the subject technology, the possible sequences of read-level voltages may be limited to different orderings of groups of read-level voltages, or predetermined sequences, rather than different orderings of the individual read-level voltages. For example, the counter array may include two counters: one corresponding to the group of read-level voltages R, RR, and RRR, and a second corresponding to the group of read-level voltages L, LL, and LLL. Under this configuration, the determined sequence of read-level voltages for the multi-state decoding operation may switch between the R, RR, and RRR read-level voltages being used first in the sequence or the L, LL, and LLL read-level voltages being used first based on the counter values in the previous decoding data. Other groupings, and orders within the groupings, are contemplated in the subject technology.

According to aspects of the subject technology, the multi-stage decoding operation represented in FIG. 3 may be executed using the determined sequence of read-level voltages. However, the multi-stage decoding operation may be modified in other ways according to the determined sequence of read-level voltages. For example, only the hard decoding operations may be performed using the determined sequence of read-level voltages, while the soft decoding operations may be executed in the default order. This configuration reduces the number of sets of decoding information that are maintained and stored for the soft decoding operations. The raw data read prior to each of the hard decoding operations may be buffered for use in the later soft decoding operations to avoid having to re-read data using a read-level voltage already used in the operation. For example, using the sequence be L, RR, C, LL, R, LLL, and RRR, hard decoding operations may be performed on raw data read using read-voltage levels L and RR before proceeding into the multi-state operation of both hard and soft decoding operations using the default sequence of C, LL, RR, L, R, LLL, and RRR if none of the initial hard decoding operations is unsuccessful in decoding the raw data. When the multi-stage decoding operation reaches a stage corresponding to one of the early hard decoding operations (e.g., L and RR), the operation would proceed directly to the soft decoding operation loop since the hard decoding using raw data read at the L and RR read levels was previously attempted. The raw data buffered from the previous hard decoding operation may be used for the soft decoding operations in these stages without needing to re-read the raw data.

The foregoing dynamic adjustment of the sequence of read-level voltages provides for the automatic adjustment of the sequence as the flash memory devices age and/or operating conditions change. Adjusting the sequence of read-level voltages potentially reduces the number of stages of the multi-stage decoding operation that must be performed prior to successfully decoding raw data read from the flash memory devices.

According to aspects of the subject technology, a machine-implemented method is provided that includes determining a sequence of a plurality of read-level voltages based on previous decoding data and executing a multi-stage decoding operation to decode raw data read from the plurality of memory cells using the determined sequence of the plurality of read-level voltages. The method further includes returning decoded data from the multi-stage decoding operation upon completion of the multi-stage decoding operation, and updating the previous decoding data based on results of the multi-stage decoding operation.

Each stage of the multi-stage decoding operation may include executing one or more decoding operations to decode raw data read from the plurality of memory cells using a respective read-level voltage from the sequence of the plurality of read-level voltages corresponding to the stage. The stages of the multi-stage decoding operation may be executed sequentially until one of the one or more decoding operations in one of the stages successfully decodes the raw data read from the plurality of memory cells.

Updating the previous decoding data may include incrementing a counter value corresponding to a read-level voltage of the plurality of read-level voltages used to read the successfully decoded raw data. The sequence of the plurality of read-level voltages may be determined based on the counter value. The previous decoding data may include counter values of a plurality of respective counters corresponding to the plurality of read-level voltages. Determining the sequence of the plurality of read-level voltages may include ordering the plurality of read-level voltages according to the counter values of the respective counters.

Determining the sequence of the plurality of read-level voltages may include selecting the sequence from a plurality of predetermined sequences. The sequence of the plurality of read-level voltages may be determined following completion of a plurality of read requests since the sequence was last determined. The plurality of memory cells are part of a block of a plurality of blocks on a die, and respective previous decoding data may be maintained for the block, a group of blocks comprising the block, or the die.

According to aspects of the subject technology, a data storage system is provided that includes a non-volatile memory device and a controller. The controller may be configured to determine a sequence of a plurality of read-level voltages based on previous decoding data and execute a multi-stage decoding operation to decode raw data read from the plurality of memory cells using the determined sequence of the plurality of read-level voltages. Each stage of the multi-stage decoding operation may include executing one or more decoding operations to decode raw data read from the plurality of memory cells using a respective read-level voltage from the sequence of the plurality of read-level voltages corresponding to the stage. The stages of the multi-stage decoding operation may be executed sequentially until one of the one or more decoding operations in one of the stages successfully decodes the raw data read from the plurality of memory cells. The controller may be further configured to return decoded data from the multi-stage decoding operation upon completion of the multi-stage decoding operation and update the previous decoding data based on results of the multi-stage decoding operation.

Updating the previous decoding data may include incrementing a counter value corresponding to a read-level voltage of the plurality of read-level voltages used to read the successfully decoded raw data. The sequence of the plurality of read-level voltages may be determined based on the counter value. The previous decoding data may include counter values of a plurality of respective counters corresponding to the plurality of read-level voltages. Determining the sequence of the plurality of read-level voltages may include ordering the plurality of read-level voltages according to the counter values of the respective counters.

Determining the sequence of the plurality of read-level voltages may include selecting the sequence from a plurality of predetermined sequences. The sequence of the plurality of read-level voltages may be determined following completion of a plurality of read requests since the sequence was last determined.

The plurality of memory cells may be part of a block of a plurality of blocks on a die. Respective previous decoding data may be maintained for the block, a group of blocks comprising the block, or the die.

According to aspects of the subject technology, a processor-readable medium encoded with executable instructions that, when executed by a processor, perform a method is provided. The method includes determining a sequence of a plurality of read-level voltages based on previous decoding data and executing a multi-stage decoding operation to decode raw data read from the plurality of memory cells using the determined sequence of the plurality of read-level voltages. The method further includes returning decoded data from the multi-stage decoding operation upon completion of the multi-stage decoding operation and updating the previous decoding data based on results of the multi-stage decoding operation by incrementing a counter value corresponding to a read-level voltage of the plurality of read-level voltages used to read the successfully decoded raw data, wherein the sequence of the plurality of read-level voltages is determined based on the counter value.

Each stage of the multi-stage decoding operation may include executing one or more decoding operations to decode raw data read from the plurality of memory cells using a respective read-level voltage from the sequence of the plurality of read-level voltages corresponding to the stage. The stages of the multi-stage decoding operation may be executed sequentially until one of the one or more decoding operations in one of the stages successfully decodes the raw data read from the plurality of memory cells.

The previous decoding data may include counter values of a plurality of respective counters corresponding to the plurality of read-level voltages. Determining the sequence of the plurality of read-level voltages may include ordering the plurality of read-level voltages according to the counter values of the respective counters. Determining the sequence of the plurality of read-level voltages may include selecting the sequence from a plurality of predetermined sequences. The sequence of the plurality of read-level voltages may be determined following completion of a plurality of read requests since the sequence was last determined.

The plurality of memory cells may be part of a block of a plurality of blocks on a die. Respective previous decoding data may be maintained for the block, a group of blocks comprising the block, or the die.

According to aspects of the subject technology, a data storage system is provided that includes a non-volatile memory, means for determining a sequence of a plurality of read-level voltages based on previous decoding data and means for executing a multi-stage decoding operation to decode raw data read from the plurality of memory cells using the determined sequence of the plurality of read-level voltages. The data storage system further includes means for returning decoded data from the multi-stage decoding operation upon completion of the multi-stage decoding operation and means for updating the previous decoding data based on results of the multi-stage decoding operation.

Each stage of the multi-stage decoding operation may include executing one or more decoding operations to decode raw data read from the plurality of memory cells using a respective read-level voltage from the sequence of the plurality of read-level voltages corresponding to the stage. The stages of the multi-stage decoding operation may be executed sequentially until one of the one or more decoding operations in one of the stages successfully decodes the raw data read from the plurality of memory cells.

Updating the previous decoding data may include incrementing a counter value corresponding to a read-level voltage of the plurality of read-level voltages used to read the successfully decoded raw data. The sequence of the plurality of read-level voltages may be determined based on the counter value. The previous decoding data may include counter values of a plurality of respective counters corresponding to the plurality of read-level voltages. Determining the sequence of the plurality of read-level voltages may include ordering the plurality of read-level voltages according to the counter values of the respective counters. Determining the sequence of the plurality of read-level voltages may include selecting the sequence from a plurality of predetermined sequences.

Many of the above-described features and applications may be implemented as software or firmware processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

The term "software" is meant to include, where appropriate, firmware residing in read-only memory or other forms of memory, which may be read into memory for processing by a processor. Also, in some implementations, multiple software aspects of the subject disclosure may be implemented as sub-parts of a larger program while remaining distinct software aspects of the subject disclosure. In some implementations, multiple software aspects may also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the present disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the present disclosure, and the present disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the present disclosure or that such aspect applies to all configurations of the present disclosure. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the present disclosure or that such implementation applies to all configurations of the present disclosure. A disclosure relating to an implementation may apply to all aspects, or one or more aspects. An implementation may provide one or more examples. A phrase such as an "implementation" may refer to one or more implementations and vice versa. A phrase such as a "configuration" does not imply that such configuration is essential to the present disclosure or that such configuration applies to all configurations of the present disclosure. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A machine-implemented method, comprising:
   determining a sequence of a plurality of read-level voltages based on decoding data, wherein the decoding data indicates which one or more read-level voltages have been used for one or more decoding operations, and wherein the sequence indicates an order of the plurality of read-level voltages to be used for a multi-stage decoding operation;
   executing the multi-stage decoding operation to decode raw data read from a plurality of memory cells using the determined sequence of the plurality of read-level voltages;
   returning decoded data from the multi-stage decoding operation upon completion of the multi-stage decoding operation; and
   updating the decoding data based on results of the multi-stage decoding operation,
   wherein the multi-stage decoding operation includes up to multiple hard decoding operations,
   wherein each unsuccessful hard decoding operation is followed by up to multiple soft decoding operations regardless of availability of another hard decoding operation, and
   wherein two or more consecutive soft decoding operations are executed without re-reading the plurality of memory cells.

2. The machine-implemented method of claim 1, wherein each stage of the multi-stage decoding operation comprises executing one or more decoding operations to decode raw data read from the plurality of memory cells using a respective read-level voltage from the sequence of the plurality of read-level voltages corresponding to the stage, and
   wherein the stages of the multi-stage decoding operation are executed sequentially until one of the one or more decoding operations in one of the stages successfully decodes the raw data read from the plurality of memory cells.

3. The machine-implemented method of claim 2, wherein updating the decoding data comprises incrementing a counter value corresponding to a read-level voltage of the plurality of read-level voltages used to read the successfully decoded raw data, and
   wherein the sequence of the plurality of read-level voltages is determined based on the counter value.

4. The machine-implemented method of claim 3, wherein the decoding data comprises counter values of a plurality of respective counters corresponding to the plurality of read-level voltages, and
   wherein determining the sequence of the plurality of read-level voltages comprises ordering the plurality of read-level voltages according to the counter values of the respective counters.

5. The machine-implemented method of claim 3, wherein the determining the sequence of the plurality of read-level voltages comprises selecting the sequence from a plurality of predetermined sequences.

6. The machine-implemented method of claim 1, wherein the sequence of the plurality of read-level voltages is determined following completion of a plurality of read requests since the sequence was last determined.

7. The machine-implemented method of claim 1, wherein the plurality of memory cells are part of a block of a plurality of blocks on a die, and
   wherein respective decoding data is maintained for the block, a group of blocks comprising the block, or the die.

8. The machine-implemented method of claim 1, wherein only hard decoding operations of the multi-stage decoding operation are to be executed using the determined sequence of the plurality of read-level voltages, and soft decoding operations of the multi-stage decoding operation are to be executed using another sequence of the plurality of read-level voltages.

9. The machine-implemented method of claim 1, further comprising:
prior to executing the multi-stage decoding operation, executing a first hard decoding operation using a first read-level voltage,
wherein each stage of the multi-stage decoding operation is associated with one respective read-level voltage from the determined sequence of the plurality of read-level voltages,
wherein when a read-level voltage of a particular stage of the multi-stage decoding operation is same as the first read-level voltage, a hard decoding operation of the particular stage is skipped, and a soft decoding operation of the particular stage is executed.

10. A data storage system, comprising:
a non-volatile memory device; and
a controller configured to:
determine a sequence of a plurality of read-level voltages based on decoding data, wherein the decoding data indicates which one or more read-level voltages have been used for one or more decoding operations, and wherein the sequence indicates an order of the plurality of read-level voltages to be used for a multi-stage decoding operation;
execute the multi-stage decoding operation to decode raw data read from a plurality of memory cells using the determined sequence of the plurality of read-level voltages, wherein each stage of the multi-stage decoding operation comprises executing one or more decoding operations to decode raw data read from the plurality of memory cells using a respective read-level voltage from the sequence of the plurality of read-level voltages corresponding to the stage, and wherein the stages of the multi-stage decoding operation are executed sequentially until one of the one or more decoding operations in one of the stages successfully decodes the raw data read from the plurality of memory cells;
return decoded data from the multi-stage decoding operation upon completion of the multi-stage decoding operation; and
update the decoding data based on results of the multi-stage decoding operation,
wherein the multi-stage decoding operation includes up to multiple hard decoding operations,
wherein each unsuccessful hard decoding operation is to be followed by up to multiple soft decoding operations regardless of availability of another hard decoding operation, and
wherein two or more consecutive soft decoding operations are to be executed without re-reading the plurality of memory cells.

11. The data storage system of claim 10, wherein updating the decoding data comprises incrementing a counter value corresponding to a read-level voltage of the plurality of read-level voltages used to read the successfully decoded raw data, and
wherein the sequence of the plurality of read-level voltages is determined based on the counter value.

12. The data storage system of claim 11, wherein the decoding data comprises counter values of a plurality of respective counters corresponding to the plurality of read-level voltages, and
wherein determining the sequence of the plurality of read-level voltages comprises ordering the plurality of read-level voltages according to the counter values of the respective counters.

13. The data storage system of claim 11, wherein determining the sequence of the plurality of read-level voltages comprises selecting the sequence from a plurality of predetermined sequences.

14. The data storage system of claim 10, wherein the sequence of the plurality of read-level voltages is determined following completion of a plurality of read requests since the sequence was last determined.

15. The data storage system of claim 10, wherein the plurality of memory cells are part of a block of a plurality of blocks on a die, and
wherein respective decoding data is maintained for the block, a group of blocks comprising the block, or the die.

16. A processor-readable medium encoded with executable instructions that, when executed by a processor, perform a method comprising:
determining a sequence of a plurality of read-level voltages based on decoding data, wherein the decoding data indicates which one or more read-level voltages have been used for one or more decoding operations, and wherein the sequence indicates an order of the plurality of read-level voltages to be used for a multi-stage decoding operation;
executing the multi-stage decoding operation to decode raw data read from a plurality of memory cells using the determined sequence of the plurality of read-level voltages;
returning decoded data from the multi-stage decoding operation upon completion of the multi-stage decoding operation; and
updating the decoding data based on results of the multi-stage decoding operation by incrementing a counter value corresponding to a read-level voltage of the plurality of read-level voltages used to read successfully decoded raw data, wherein the sequence of the plurality of read-level voltages is determined based on the counter value,
wherein the multi-stage decoding operation includes up to multiple hard decoding operations,
wherein each unsuccessful hard decoding operation is followed by up to multiple soft decoding operations regardless of availability of another hard decoding operation, and
wherein two or more consecutive soft decoding operations are executed without re-reading the plurality of memory cells.

17. The processor-readable medium of claim 16, wherein each stage of the multi-stage decoding operation comprises executing one or more decoding operations to decode raw data read from the plurality of memory cells using a respective read-level voltage from the sequence of the plurality of read-level voltages corresponding to the stage, and
wherein the stages of the multi-stage decoding operation are executed sequentially until one of the one or more decoding operations in one of the stages successfully decodes the raw data read from the plurality of memory cells.

18. The processor-readable medium of claim 17, wherein the decoding data comprises counter values of a plurality of respective counters corresponding to the plurality of read-level voltages, and wherein determining the sequence of the plurality of read-level voltages comprises ordering the plurality of read-level voltages according to the counter values of the respective counters.

19. The processor-readable medium of claim 17, wherein determining the sequence of the plurality of read-level voltages comprises selecting the sequence from a plurality of predetermined sequences.

20. A data storage system comprising:
non-volatile memory;
means for determining a sequence of a plurality of read-level voltages based on decoding data, wherein the decoding data indicates which one or more read-level voltages have been used for one or more decoding operations, and wherein the sequence indicates an order of the plurality of read-level voltages to be used for a multi-stage decoding operation;
means for executing the multi-stage decoding operation to decode raw data read from a plurality of memory cells using the determined sequence of the plurality of read-level voltages;
means for returning decoded data from the multi-stage decoding operation upon completion of the multi-stage decoding operation; and
means for updating the decoding data based on results of the multi-stage decoding operation,
wherein the multi-stage decoding operation includes up to multiple hard decoding operations,
wherein each unsuccessful hard decoding operation is to be followed by up to multiple soft decoding operations regardless of availability of another hard decoding operation, and
wherein two or more consecutive soft decoding operations are to be executed without re-reading the plurality of memory cells.

21. The data storage system of claim 20, wherein each stage of the multi-stage decoding operation comprises executing one or more decoding operations to decode raw data read from the plurality of memory cells using a respective read-level voltage from the sequence of the plurality of read-level voltages corresponding to the stage, and
wherein the stages of the multi-stage decoding operation are executed sequentially until one of the one or more decoding operations in one of the stages successfully decodes the raw data read from the plurality of memory cells.

22. The data storage system of claim 21, wherein updating the decoding data comprises incrementing a counter value corresponding to a read-level voltage of the plurality of read-level voltages used to read the successfully decoded raw data, and
wherein the sequence of the plurality of read-level voltages is determined based on the counter value.

23. The data storage system of claim 22, wherein the decoding data comprises counter values of a plurality of respective counters corresponding to the plurality of read-level voltages, and
wherein determining the sequence of the plurality of read-level voltages comprises ordering the plurality of read-level voltages according to the counter values of the respective counters.

24. The data storage system of claim 23, wherein determining the sequence of the plurality of read-level voltages comprises selecting the sequence from a plurality of predetermined sequences.

* * * * *